(12) United States Patent
Berezin et al.

(10) Patent No.: US 7,719,592 B2
(45) Date of Patent: *May 18, 2010

(54) MULTI JUNCTION APS WITH DUAL SIMULTANEOUS INTEGRATION

(75) Inventors: Vladimir Berezin, La Crescenta, CA (US); Eric R. Fossum, La Crescenta, CA (US)

(73) Assignee: Aptina Imaging Corp., George Town, Grand Cayman (KY)

( * ) Notice: Subject to any disclaimer, the term of this patent is extended or adjusted under 35 U.S.C. 154(b) by 5 days.

This patent is subject to a terminal disclaimer.

(21) Appl. No.: 12/081,660

(22) Filed: Apr. 18, 2008

(65) Prior Publication Data

US 2008/0225150 A1 Sep. 18, 2008

Related U.S. Application Data

(63) Continuation of application No. 10/758,013, filed on Jan. 16, 2004, now Pat. No. 7,372,490, which is a continuation of application No. 09/519,930, filed on Mar. 7, 2000, now Pat. No. 6,724,426.

(60) Provisional application No. 60/124,153, filed on Mar. 8, 1999.

(51) Int. Cl.
*H04N 5/335* (2006.01)
(52) U.S. Cl. .................. 348/308; 348/294; 348/311
(58) Field of Classification Search .......... 348/303–307
See application file for complete search history.

(56) References Cited

U.S. PATENT DOCUMENTS

| | | | |
|---|---|---|---|
| 5,710,446 A * | 1/1998 | Chi et al. | 257/225 |
| 5,981,932 A * | 11/1999 | Guerrieri et al. | 250/208.1 |
| 6,040,593 A | 3/2000 | Park | |
| 6,180,969 B1 | 1/2001 | Yang et al. | |
| 6,184,055 B1 | 2/2001 | Yang et al. | |
| 6,310,369 B1 | 10/2001 | Narabu et al. | |
| 6,388,243 B1 | 5/2002 | Berezin et al. | |
| 6,486,503 B1 | 11/2002 | Fossum | |
| 6,498,622 B1 * | 12/2002 | Nakashiba | 348/308 |
| 6,624,850 B1 | 9/2003 | Guidash | |
| 6,724,426 B1 * | 4/2004 | Berezin et al. | 348/308 |
| 7,372,490 B2 * | 5/2008 | Berezin et al. | 348/308 |

* cited by examiner

*Primary Examiner*—Luong T Nguyen
(74) *Attorney, Agent, or Firm*—Dickstein Shapiro LLP

(57) ABSTRACT

A new kind of pixel is formed of two floating diffusions of different sizes and different conductivity type. The two floating diffusions have different image characteristics, and hence form a knee-shaped slope.

12 Claims, 2 Drawing Sheets

MULTI JUNCTION APS WITH DUAL SIMULTANEOUS INTEGRATION

CROSS REFERENCE TO RELATED APPLICATIONS

This application claims benefit of U.S. Provisional application No. 60/124,153, filed Mar. 8, 1999.

This application is a continuation application of U.S. Ser. No. 10/758,013, filed Jan. 16, 2004, which is a continuation application of U.S. App. No. 09/519,930, filed Mar. 7, 2000 (U.S. Pat. No. 6,724,426), which claims priority from U.S. Provisional App. No. 60/124,153, filed Mar. 8, 1999, the complete disclosures of each of which are incorporated by reference herein.

BACKGROUND

Active pixel sensors are described in U.S. Pat. No. 5,417,215. Higher charge and efficiency from these devices is desirable. In addition, different parameters and operations can benefit from different kinds of samples. For example, a short sampling period can provide the highest amount of dynamic range, while a longer sampling period can provide better resolution. Fossum and Yadid-Pecht have described one such system and "Wide Intrascene Dynamic Range CMOS APS Using Dual Sampling, IEEE Transactions On Electronic Devices, volume 44 page 1721-1723, October 1997. In that system, two signals are obtained using two different integration intervals.

SUMMARY

The present application teaches a new pixel design with dual floating diffusion regions, each of which is separately controlled. The two regions collectively provide dual integration, but do so in a way that increases sensitivity, allows dual dynamic range, and also provides multiple junctions for improved photocarrier detection.

BRIEF DESCRIPTION OF THE DRAWINGS

The foregoing and other advantages and features of the invention will become more apparent from the detailed description of exemplary embodiments of the invention given below with reference to the accompanying drawings, in which.

DETAILED DESCRIPTION

Figure 1:
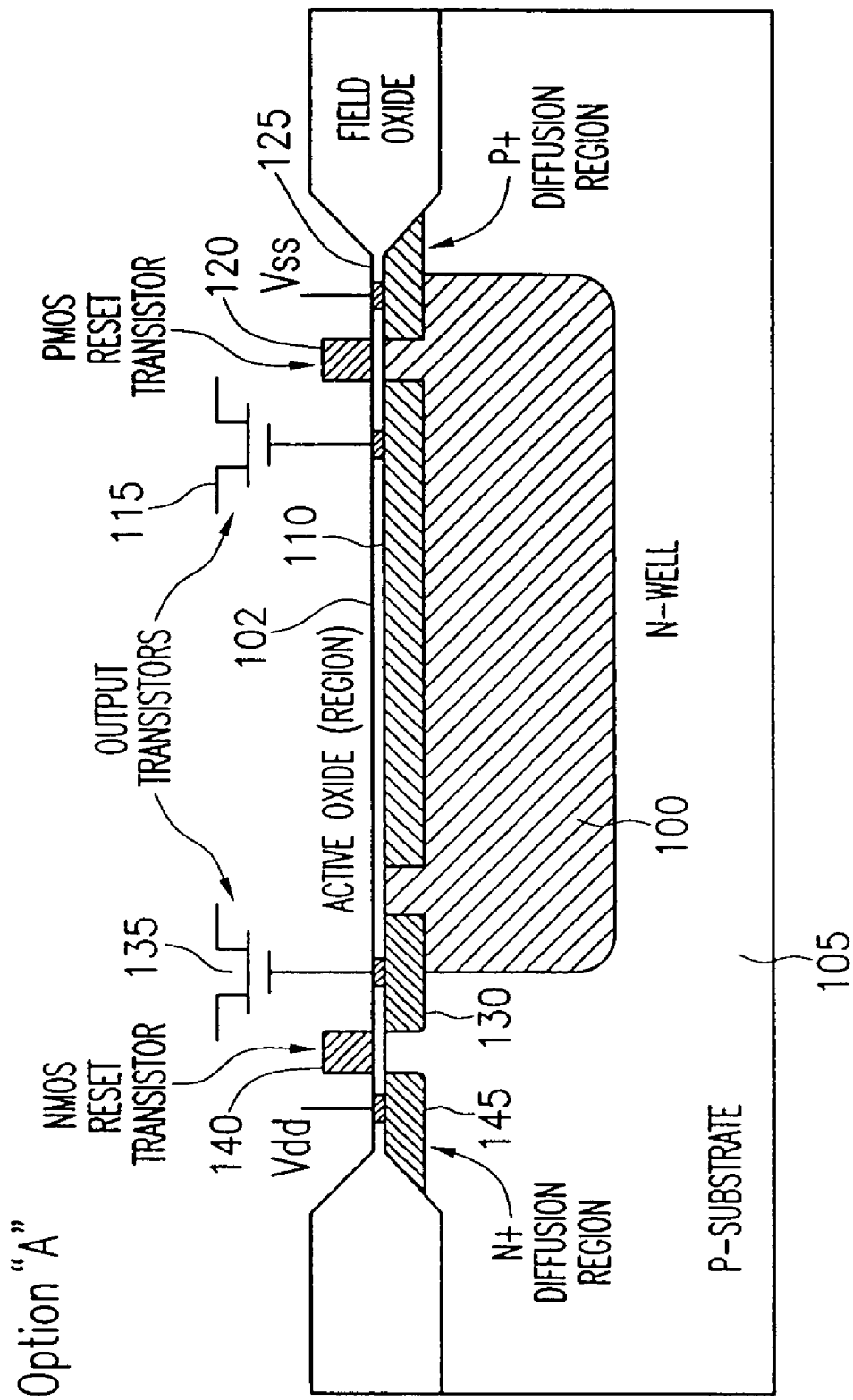
FIG. 1 is an illustration of a first embodiment of the invention.

FIG. 1 shows a first embodiment which is formed by a more standard CMOS fabrication process. There is a relatively large floating diffusion capacitance, which can tend to reduce the charge conversion gain. However, this system may be easier to make due to its use of a standard CMOS process, with the floating diffusion being on the surface.

An N-type well 100 is formed in the P-type substrate 105. A first floating diffusion region 110 is a P-type floating diffusion region formed on the surface, i.e., its top surface close to or touching the active oxide region 102. The P-type floating diffusion region 110 is connected to a P-type output transistor 115 and a P-type reset transistor 120. The reset transistor 120 connects to a P+-type diffusion region 125 which is biased, for example, to the voltage level of the drain voltage.

The second floating diffusion region 130 is an N-type floating diffusion region. Note that the second floating diffusion region 130 takes up a much smaller area then the first floating diffusion region, e.g. one fifth as much area.

The second floating diffusion region is N-type, and is connected to an N-type output transistor 135. An NMOS reset transistor 140 connects the floating diffusion region to N+ diffusion region 145, which can be connected to a supply voltage level. In this way, a P-type region is formed extending from the edge of the P-type floating diffusion 110 to the edge of the P-type diffusion 125. The N-type region, starting at floating diffusion 130, is separate from the P-type region. In addition, the N-type region can surround virtually the entire active P type region, and all of the P+ region.

This new pixel design needs two separate reset control lines, one for the NMOS reset transistor 140 and the other for the PMOS reset transistor 120. One column can be used for both output signals, e.g. with two select control lines. Alternately, two output columns can be used with one select line.

Note that since the size of the two different floating diffusion regions is different, they will store different amounts of charge. Therefore, the floating diffusion 110 can store more charge then the floating diffusion 135. Different integration periods for these two diffusion floating regions allow a flexible saturation exposure for each element. It also facilitates obtaining a highlighted compression knee sloped light transfer curve.

Figure 2:
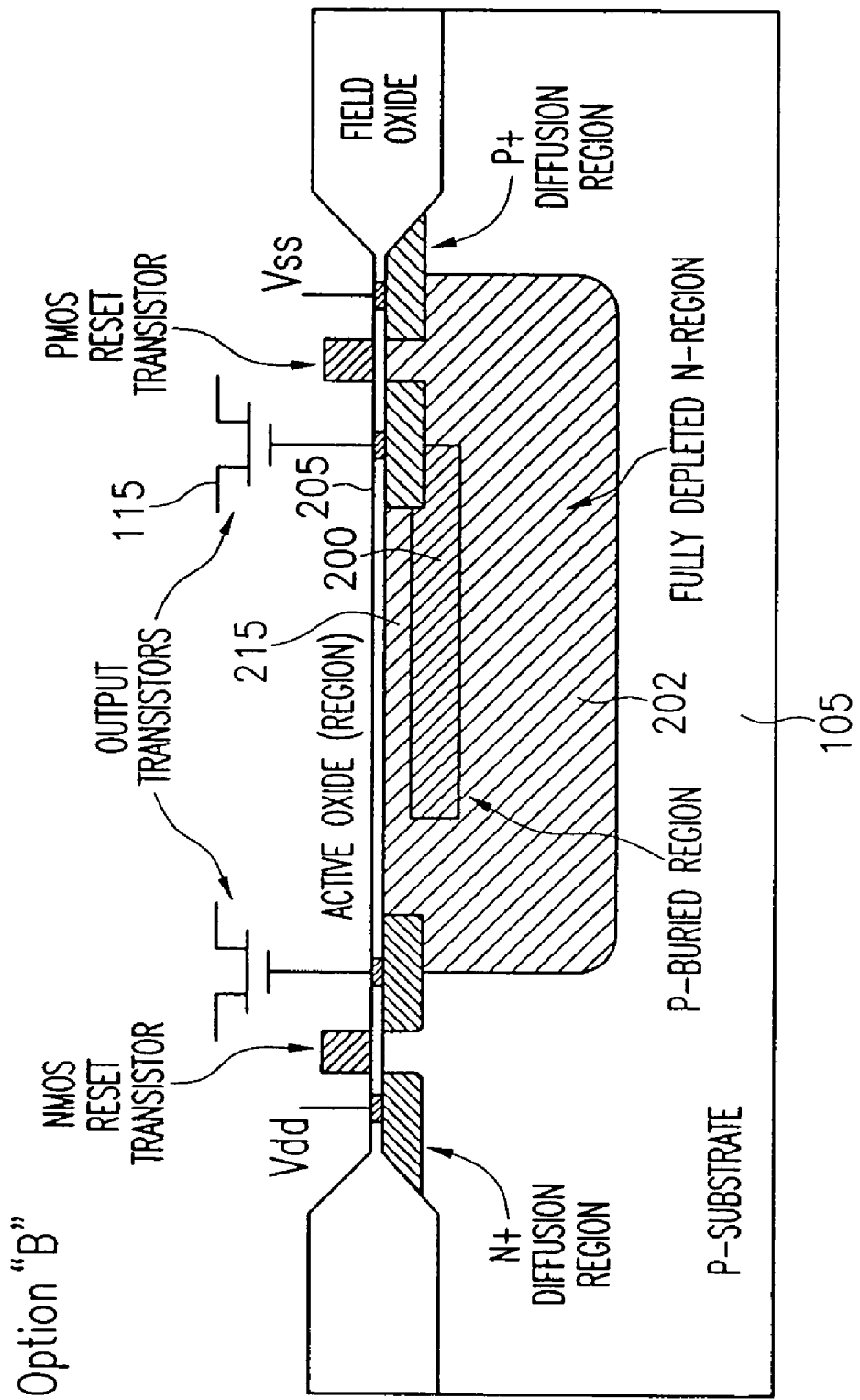
FIG. 2 is an illustration of a second embodiment of the invention.

A second embodiment is shown in FIG. 2. In this embodiment, the P type diffusion region 200 is formed below the surface of the N-well 202. An overlying N region 215 is formed above the floating diffusion, covered by the active oxide. The N-well 202, in this embodiment, is arranged to be fully depleted. A second smaller floating diffusion region 205 is connected to the buried floating diffusion 200, and is connected to output transistor 115. In this way, there are three superimposed PN junctions: A first junction between the overlying N region area 215 and the buried floating diffusion 200. Another PN junction is formed between the bottom of the floating diffusion 215 and the N region 202. The third PN junction is between the fully depleted N region 202, and the P type substrate 105. The capacitance for the floating N type diffusion can be reduced by this structure.

Although only a few embodiments have been disclosed and detailed above, other modifications are possible. All such modifications are intended to be encompassed within the following claims, in which:

What is claimed is:

1. A pixel cell, comprising:
    a substrate;
    a semiconductor well, formed in said substrate;
    a plurality of floating diffusion regions each in contact with said semiconductor well; and
    a plurality of output transistors each having a gate coupled to a respective one of said plurality of floating diffusion regions.

2. The pixel cell of claim 1, wherein each of said plurality of floating diffusion regions is formed at a surface of the semiconductor well.

3. The pixel cell of claim 1, further comprising:
    an active oxide covering a surface of said semiconductor well.

4. The pixel cell of claim 1, wherein each of said floating diffusion regions is coupled to a respective reset transistor for supplying a reset voltage in response to a reset signal.

5. The pixel cell of claim 1, wherein said semiconductor substrate is of a first conductivity type and said semiconductor well is of a second conductivity type different from said first conductivity type.

6. An image sensor, comprising:
a semiconductor substrate;
a photosensor for supplying photogenerated charge based on light impinging upon said photosensor;
a first semiconductor well formed within said semiconductor substrate;
a plurality of floating diffusion regions each at least partially formed in said first semiconductor well and for storing photogenerated charge; and
a plurality of transistor connection elements operably connected to a respective one of said plurality of floating diffusion regions and for generating signals indicating respective amounts of said photogenerated charge collected by said floating diffusion regions.

7. The sensor of claim 6, further comprising:
a plurality of reset elements each for resetting a respective one of said floating diffusion regions.

8. The sensor of claim 6, wherein said semiconductor substrate is P-type, said semiconductor well is N-type, and said plurality of floating diffusion regions includes at least one N-type region and at least one P-type region.

9. The sensor of claim 6, wherein at least one of said floating diffusion regions surrounds another one of said floating diffusion regions.

10. The sensor of claim 6, wherein when said sensor is operational said semiconductor well is fully depleted.

11. A method of converting light to a signal, comprising:
photogenerating charge in response to incoming light;
receiving photogenerated charge in a plurality of floating diffusion regions each producing an output indicative of a different gradation of the incoming light; and
sampling said charge received by each of said floating diffusion regions using a transistor.

12. The method of claim 11, wherein each said transistor used to sample a floating diffusion region has a same conductivity type as the floating diffusion region being sampled.

* * * * *